US007848531B1

(12) United States Patent
Vickers et al.

(10) Patent No.: US 7,848,531 B1
(45) Date of Patent: Dec. 7, 2010

(54) METHOD AND APPARATUS FOR AUDIO LOUDNESS AND DYNAMICS MATCHING

(75) Inventors: Earl Vickers, Santa Cruz, CA (US); Jean-Marc Jot, Aptos, CA (US)

(73) Assignee: Creative Technology Ltd., Singapore (SG)

(*) Notice: Subject to any disclaimer, the term of this patent is extended or adjusted under 35 U.S.C. 154(b) by 1486 days.

(21) Appl. No.: 10/043,591

(22) Filed: Jan. 9, 2002

(51) Int. Cl.
*H03G 3/00* (2006.01)
(52) U.S. Cl. .......................................... 381/107; 700/94
(58) Field of Classification Search ......... 381/104–109, 381/57, 22; 700/94
See application file for complete search history.

(56) References Cited

U.S. PATENT DOCUMENTS

| 5,404,315 | A  | * | 4/1995  | Nakano et al. ............... 381/102 |
| 5,524,060 | A  | * | 6/1996  | Silfvast et al. ............... 381/104 |
| 5,884,269 | A  | * | 3/1999  | Cellier et al. ............... 704/501 |
| 5,956,674 | A  | * | 9/1999  | Smyth et al. ............. 704/200.1 |
| 6,351,733 | B1 | * | 2/2002  | Saunders et al. ............ 704/500 |
| 6,414,960 | B1 | * | 7/2002  | Kuhn et al. ............ 370/395.64 |
| 6,704,421 | B1 | * | 3/2004  | Kitamura .................... 381/103 |
| 6,759,585 | B2 |   | 7/2004  | Hatanaka |
| 6,826,350 | B1 | * | 11/2004 | Kashino et al. ............... 386/46 |
| 7,242,784 | B2 | * | 7/2007  | Cranfill et al. ............. 381/107 |
| 2004/0062401 | A1 | * | 4/2004 | Davis ........................... 381/1 |

OTHER PUBLICATIONS

Sound Forge Product Literature, www.sonicfoundry.com/products/NewShowProduct.asp?PID+426, date unknown.
Neoran et al., "A Perspective Loudness-Sensitive Leveler for Audio Broadcasting and Mastering", date unknown.
Dolby Laboratories, Inc., "A Guide to Dolby Metadata", date unknown.
Vickers, "Automatic Long-Term Loudness and Dynamics Matching", Audio Engineering Society 111th Convention, Sep. 21-24, 2001.
Kraight, "Aliasing in Digital Clippers and Compressors" J. Audio Eng. Soc., vol. 48, No. 11, Nov. 2000, pp. 1060-1065.
Floru, "Attack and Release Time Constants in RMS-Based Feedback Compressors", J. Audio Eng. Soc., vol. 47, No. 10, Oct. 1999, pp. 788-803.

(Continued)

*Primary Examiner*—Vivian Chin
*Assistant Examiner*—Lun-See Lao
(74) *Attorney, Agent, or Firm*—Schwegman, Lundberg & Woessner, P.A.

(57) ABSTRACT

The overall loudness of an audio track is calculated by combining a number of weighted loudness measures for segments of the audio track, where the weight applied to each individual loudness measure is a function of the loudness measure. By comparing the original overall loudness measure to a desired overall loudness measure, a gain can be determined that will adjust the loudness level to the desired value. Also disclosed is a dynamic compression method that analyzes the dynamic characteristics of an audio track and determines appropriate compressor parameters. Additionally, the loudness of a post-compressor audio track can be estimated for any given compressor parameters, thus permitting post-compression loudness matching to be done even if the compression is performed in real-time.

14 Claims, 12 Drawing Sheets

OTHER PUBLICATIONS

Robinson, et al. "Dynamic Range Control via Metadata" AES 107th Convention, Sep. 24-27, 1999.
Zwicker, et al. "Psychoacoustics", Jan. 1999, pp. 315-325.
Dutilleux, "Filters, Delays, Modulations and Demodulations A Tutorial", ZKM Institute for Music and Acoustics, Nov. 19-21, 1998.
Dolby Laboratories, Inc. "Dolby Digital Broadcast Implementation Guidelines", 1998.
Moore, "A Model for the Prediction of Thresholds, Loudness, and Partial Loudness", J. Audio Eng. Soc., vol. 45, No. 4, Apr. 1997, pp. 224-239.
Allen, "Are Movies Too Loud?", SMPTE Film Conference, Mar. 22, 1997.
Stone, "Dynamic aspects of loudness: A real-time loudness meter", British Journal of Audiology, vol. 30, 1996.
Zolzer, "Digital Audio Signal Processing", Technical University of Hamburg-Harburg, Germany, 1995, pp. 207-219.
Bateman, et al., "Digital Signal Processing Design", Computer Science Press, 1989, pp. 307-311.
McNally, "Dynamic Range Control of Digital Audio Signals", J. Audio Eng. Soc., vol. 32, No. 5, May 1984, pp. 316-327.
Zwicker, "Critical Band Width in Loudness Summation", The Journal of The Acoustical Society of America, vol. 20, No. 5, May 1957, pp. 548-557.

* cited by examiner

METHOD AND APPARATUS FOR AUDIO LOUDNESS AND DYNAMICS MATCHING

BACKGROUND OF THE INVENTION

Loudness is a subjective measure relating to the physical sound pressure level (SPL) as perceived by the human ear. A number of devices have been created for controlling audio levels to modify either a signal's loudness or its range of loudness. Automatic gain controls are typically used to reduce loudness differences between audio programs (for example, between one audio track and the next). Dynamic compressors are similar to automatic gain controls, but are primarily intended to reduce the loudness range within a single track or audio program.

Compressors have a number of uses, including increasing the loudness of the softer parts of an audio program so they can be heard above the noise floor (e.g., for automotive listening), decreasing the loudness of the loudest segments (for example, to avoid disturbing neighbors during late-night listening), and keeping signal levels within technical limits required for radio broadcast.

Loudness matching and dynamic compression both pose challenges to creators of audio hardware and software. For example, different audio tracks may have different dynamic ranges, and the short-term loudness of those tracks may vary significantly over time; both factors complicate the effort to match the long-term loudness of the tracks. In the case of dynamic compression, a compressor may apply different amounts of compression to an audio track depending on how that track is scaled. Similarly, a compression scheme may apply compression to an audio track that is already highly compressed, and may apply no compression to a track that would benefit therefrom. Still further, one side effect of dynamic compression is that it can have different effects on the overall loudness of different audio tracks, making it difficult to perform post-compressor loudness matching in real-time.

SUMMARY OF THE INVENTION

According to one aspect of the invention, provided is a method for matching the loudness of an entire song, sound file or other audio track to a desired level. Preferably, the method uses a weighted loudness measure, the "long-term loudness matching level," (LLML) that takes into account the dynamic characteristics of the audio track.

According to another aspect of the invention, provided is a compression method that analyzes the dynamic characteristics of an audio track and determines appropriate compression parameters based on the dynamic characteristics of an audio track. This prevents over-compressing audio that already has limited dynamics.

According to another aspect of the invention, provided is a method of estimating the loudness of a post-compression audio track for any given compressor parameters. This permits post-compression loudness matching to be done if the compression is done in real-time.

According to a further aspect of the invention there is provided a method of adjusting the dynamics of an audio track, comprising:

deriving, from the audio track, a set of metadata describing a statistical distribution of levels encountered in the audio track;

deriving, from the metadata, a time-varying gain to modify the statistical distribution of levels; and applying the time-varying gain to the audio track to obtain a resulting audio track.

The step of deriving the time varying gain may comprise:

specifying a desired statistical dynamics distribution;

deriving a transfer function from the metadata and from the desired statistical dynamics distribution; and deriving the time-varying gain from the transfer function such that a final statistical dynamics distribution encountered in the resulting audio track is substantially similar to the desired statistical dynamics distribution.

Further, the step of deriving the time varying gain may comprise:

specifying a desired overall loudness for the audio track;

deriving an estimate of the loudness of the resulting audio track from the metadata and from an initial estimate of the time-varying gain;

deriving a correction factor from the desired overall loudness and from the estimate of the loudness of the resulting audio track; and applying the correction factor to the initial estimate of the time-varying gain to obtain the time-varying gain.

Still further, the step of deriving the time varying gain may comprise:

deriving, from histogram data of levels encountered in the audio track, an original dynamic spread value representing a spread of the levels encountered in the audio track;

performing a comparison between the original dynamic spread value and a desired dynamic spread value; and deriving parameters for the derivation of the time-varying gain from the comparison.

The step of deriving parameters may comprise the step of determining a slope of a segment of a compressor transfer function, and the step of determining the slope may comprise:

applying a test compression scheme to the histogram data to obtain test histogram data, the test compression scheme including a test slope;

determining a test dynamic spread value from the test histogram data; and deriving the slope based on a comparison of the original dynamic spread value, the desired dynamic spread value and the test dynamic spread value.

According to a further aspect of the invention there is provided a method of adjusting the loudness of an audio track including a plurality of audio frames, the method comprising:

obtaining loudness values for each of the plurality of audio frames;

applying a weighting factor to each of the loudness values to obtain a plurality of weighted loudness values;

aggregating the weighted loudness values to obtained an overall loudness value for the audio track;

comparing the overall loudness value to a desired loudness value; and applying a gain to the audio track based on the comparison between the overall loudness value and the desired loudness value.

According to a further aspect of the invention there is provided a method of altering a dynamic range of an audio track comprising a plurality of audio frames each having a loudness value, the method comprising:

obtaining original statistical frequency data for the audio track;

applying a test compression scheme to the original statistical frequency data to obtain test statistical frequency data;

deriving from the original statistical frequency data and the test statistical frequency data an actual compression scheme; and compressing the audio track using the actual compression scheme.

According to a further aspect of the invention there is provided a method of processing an audio track comprising:

obtaining statistical frequency data for the audio track;

applying a compression scheme to the statistical frequency data to obtain an estimate of statistical frequency data that would result from applying the compression scheme directly to the audio track;

determining an estimated overall compressed loudness value from the estimate of statistical frequency data;

compressing the audio track using the compression scheme to obtain a compressed audio track; and applying a gain to the compressed audio track based on a comparison between the estimated overall compressed loudness value and a desired loudness value.

Other objects, features, and advantages of the present invention will become apparent from a consideration of the following detailed description and from the accompanying descriptions.

TERMINOLOGY

As used herein, the term "audio track" is used to describe a unit of audio upon which it may be desired to perform an adjustment of loudness or loudness range. An audio track may be any type of audio (a piece of music, speech, etc.) and may be represented in any way, whether digital or analog, and in any form, stored or transmitted. An audio track typically represents a piece of audio that may be, but is not necessarily, considered to be a single unit as far as a listener is concerned, and upon which it is thus convenient to perform loudness adjustment or compression based on a single set of parameters. Note however that an audio track may itself be a portion of a larger "single" unit of audio, for example a motion picture or computer game soundtrack, and may be chosen in a manner that is not consistent with a generally accepted "audio track."

The term "frame" is used to describe a sub-unit or sample of an audio track that is useful to consider when evaluating the characteristics of an audio track. Note that a reference to a number of frames does not imply that the frames are contiguous, or that all the frames under consideration can be assembled into the audio track from which they are taken.

Note also that the term "compression" as used herein refers to the adjustment of the dynamic spread of an audio track, and does not refer to data compression (i.e. techniques used to reduce the size of an audio or data file.) The invention may of course be used in conjunction with data compression techniques. Also, "compression" is used herein to encompasses both contraction as well as expansion of the dynamic spread of an audio track.

DETAILED DESCRIPTION OF THE INVENTION

Figure 1:
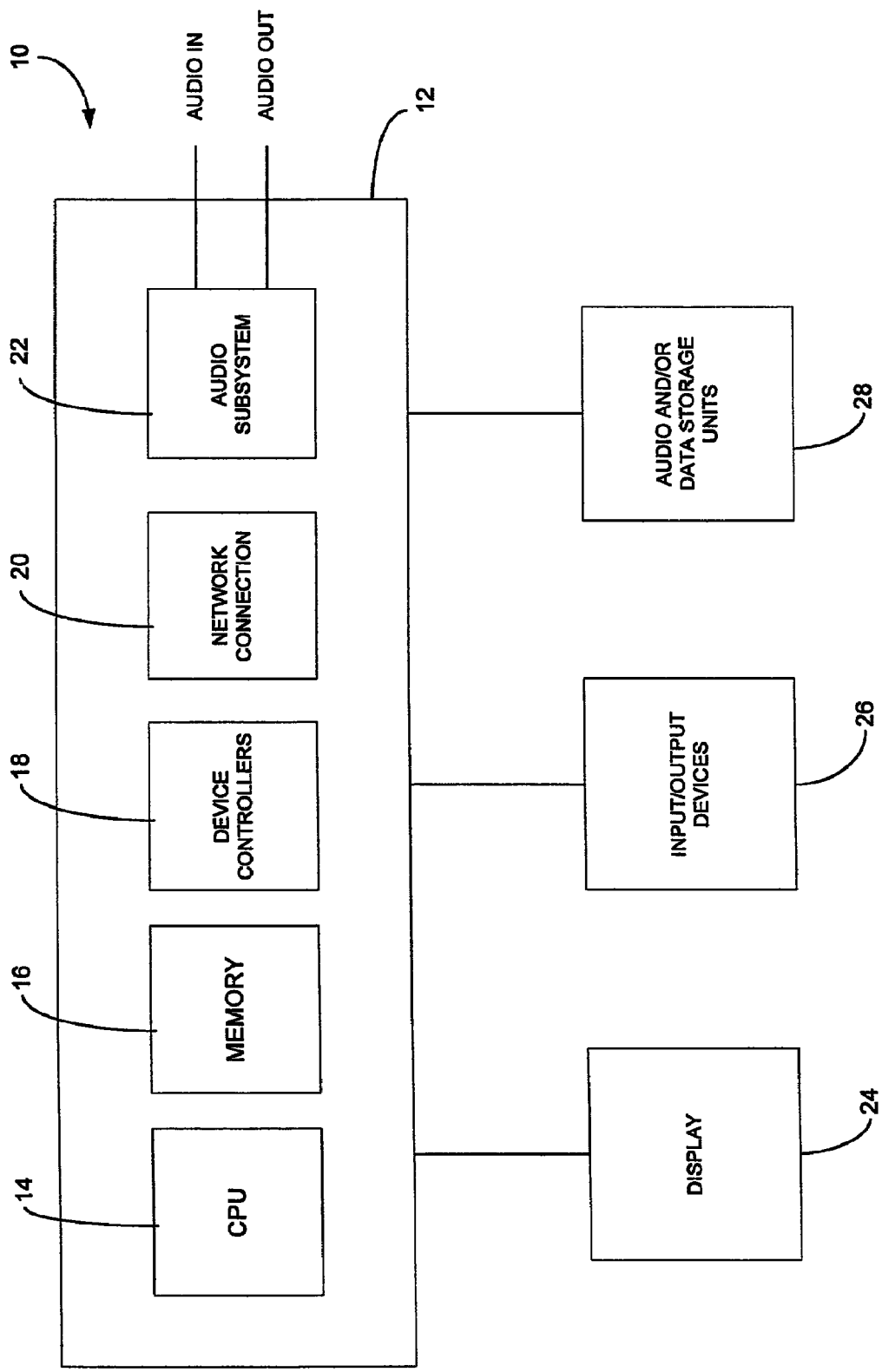
FIG. 1 is a schematic diagram illustrating a generalized system in which the invention is implemented.

Turning to FIG. 1, shown is a generalized system 10 in which the invention may be implemented. The system 10 includes a host processor 12 that includes a central processing unit 14, associated memory 16, device controllers 18, a network connection 20 and an audio subsystem 22. Coupled to the host processor 12 are a display 24, input/output devices 26, and audio and/or data storage units 28. The audio subsystem may receive or output and audio signal or audio data in digital or analog format.

In one embodiment, the system 10 may be a personal computer, in which case the audio subsystem 22 may be a sound card or audio functionality integrated with the motherboard, the input/output devices 26 may include a mouse and keyboard, the display 24 is a conventional computer display, and the network connection may be a modem, a network interface card, a high speed internet connection, or other wired or wireless network connection. Additionally, the storage units may include magnetic, optical or other drives operating on fixed or removable media. Further, the system 10 may interact with other external devices, such as MP3 players, RF receivers or transmitters, A/V (audio/video) equipment, devices wired to a home network etc.

In another embodiment, the system 10 may be a dedicated audio device such as an A/V receiver, a cable, satellite or other broadcast receiver, a portable audio device such as an MP3 or portable CD player, a DVD player, etc. In such a case, the functionality shown in FIG. 1 may be adapted or eliminated as necessary in the particular device.

As a general proposal however, the methods and functionality disclosed herein may be implemented in any applicable audio-related devices used anywhere along the chain of audio generation, recording, processing and playback. The methods and functionality disclosed herein may also be implemented in software or hardware. Additionally, the audio itself may be in any of a number of audio formats, whether analog or digital, and may be provided in a number of different ways (broadcast, streaming media, downloaded or otherwise transmitted over networks, extracted or converted from any number of sources, played back conventionally from media such as compact discs, digital video discs, etc.)

The loudness of an audio track may be calculated in a number of different ways. For example, the loudness of a signal may be calculated by determining an average level for all of the frames comprising the audio track. Similarly, the loudness of an audio signal may be calculated by taking an average level for a set of the loudest frames comprising the audio track, since it is believed that the loudest frames contribute the most to the perception of overall loudness.

When trying to match the loudness of two audio tracks having very different dynamic ranges, sole reliance upon either the loudest or the average frame levels may result in a mismatch of perceived loudness. For example, in FIG. 2, signal 1 has a wide dynamic range of 80 dB (from −80 to 0 dB), while signals 2 and 3 have only a 20 dB range. Signals 1 and 2 may have the same average frame loudness, but signal 1 will probably be perceived as louder, since louder segments appear to have a stronger influence on the perception of overall loudness. On the other hand, signals 1 and 3 have the same maximum loudness, but signal 3 may be perceived as louder because the signal is generally stronger than signal 1.

To address these issues when determining the overall loudness (the "long-term loudness matching level" or LLML) of an audio track, a series of individual (i.e. per frame) loudness values are obtained for a number of frames that make up the audio track. The individual loudness values are then weighted in a manner that emphasizes the relatively greater effect that louder frames have on loudness perception, while still taking into account the contribution to overall loudness made by less loud frames.

To obtain the individual loudness values, any reasonable method of obtaining per-frame values, such as the root-mean-square (RMS) method, may be used.

The RMS for the frame is determined by performing the RMS function on the values in the frame divided by digital full scale, or 0 dB (i.e. normalized to full scale). The resulting RMS value is then converted a decibel value, with the reference level (i.e. 0 dB) being the RMS value of a full scale square wave. The RMS value of a full scale square wave normalized to full scale is 1, hence the resulting individual loudness value $V_{dB}(i)$, expressed in decibels, for a frame (i), can be represented as:

$$V_{dB}(i) = 20 \log_{10}(V_{rms}(i))$$

The LLML is then obtained by taking a weighted average of the individual level estimates:

$$L = \sum_{i=0}^{M-1} w(i) V_{dB}(i),$$

where L is the long-term loudness matching level in dB and M is the number of frames under consideration.

The weighting factor w for an individual frame is based on an emphasis parameter k raised to the negative power of the loudness values for the individual frame, as follows:

$$u(i) = k^{-V_{dB}(i)}, 0 < k \leq 1$$

The weight u(i) for an individual frame is then normalized by dividing it by the sum of all of the weights:

$$w(i) = \frac{u(i)}{\sum_{j=0}^{M-1} u(j)}$$

Thus, the weight applied to each individual $V_{dB}$ measurement is an emphasis parameter k raised to the negative $V_{dB}(i)$ power, normalized so that the sum of the weights is unity.

From a review of the equations for the LLML, it can be seen that If k=1, the LLML becomes a simple average of the individual $V_{dB}$ measurements. As k approaches 0, the LLML approaches the level of the loudest single individual frame. At intermediate values, for example, k=0.85, the LLML gives a moderate emphasis to the louder frames, as desired. As long as k<1, any number of additional silent frames will have no significant effect on the result, but all non-silent frames will be represented.

The particular value of k may be defined at the time the audio track is to be presented A value of k may be chosen to best model the extent to which humans emphasize louder frames in their comparisons of the loudness of extended audio tracks.

To perform loudness matching, the analyzed LLML is now used to determine the amount of gain needed to convert the analyzed LLML to a target level. If no compression is applied, the desired gain is:

$$g = 10^{\frac{L_t - L_a}{20}},$$

where $L_t$ is the target LLML and $L_a$ is the analyzed LLML. If $L_t$ is set to a high level, a peak limiter may be helpful to avoid the possibility of clipping. Alternatively, clipping can be prevented by constraining the gain such that $$g \leq \frac{V_{max}}{|V_{peak}|},$$

where $V_{max}$ is the full-scale positive amplitude and $V_{peak}$ is the instantaneous peak amplitude of the input signal.

The values of the individual loudness value $V_{dB}(i)$ can be obtained from an analysis of the original audio track. This analysis phase could take place while audio data is being "ripped" from compact disks, during download from a network, or as a background process. Since a statistical analysis is being performed, it may not be necessary to analyze the entire audio track. For example, it may suffice to analyze 500 or fewer frames, somewhat randomly chosen, independent of the length of the audio track.

Alternatively, a $V_{dB}$ histogram (described in more detail below) may be used to generate the LLML. In such a case, a good approximation of the LLML can easily be constructed from the histogram data. For example, if the histogram provides that there are 200 frames at 80 dB, a $V_{dB}$ value of 80 dB will be used 200 times in the equations above for L and w. If the histogram is quantized to one-percentile increments, the audio track analysis process for generating the histogram results in a very small amount of data, on the order of a hundred bytes per audio track. This data (or in fact the actual $V_{dB}$ data) could easily be stored as metadata on media containing the audio track, (such as CDs or DVDs), as sidestream data in streaming audio formats, in playlist tables, etc. This metadata can be generated without human intervention and does not force the playback system to use pre-determined values for loudness or compression parameters.

Human perception of loudness varies with the frequency of a sound, and additional processing may be conducted in conjunction with the loudness matching to take these perceptual differences into account. One way of performing this frequency-weighting would be a simple pre-emphasis of the audio track using an inverted equal-loudness curve; for example, the well-known "B" weighting curve that is applied to sound playback at moderate levels such as those encountered in home listening situations. The "B" curve pre-emphasis is only a rough approximation, not only because the actual playback level may not be known, but also because the equal loudness contours constitute a family of curves and cannot be duplicated using a single linear filter. Nevertheless, this approximation may be useful.

Figure 3:
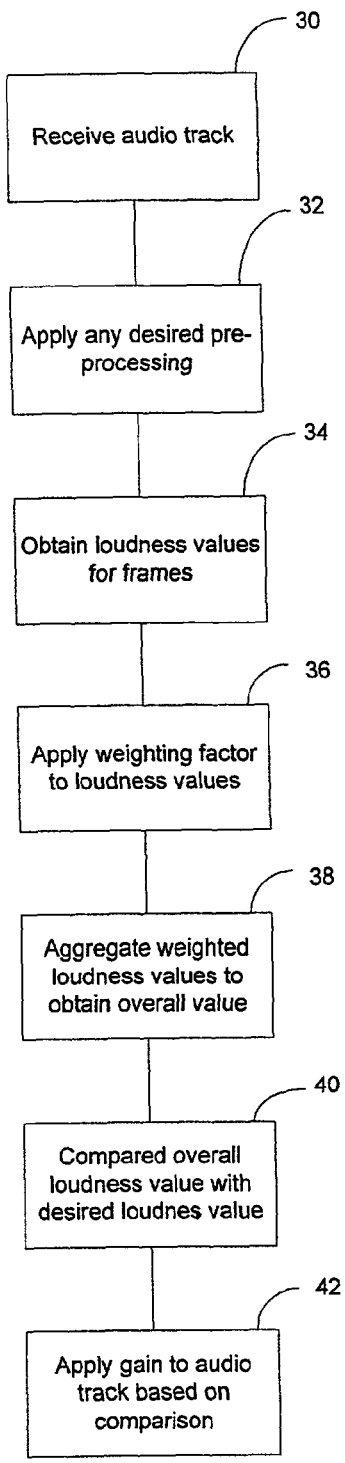
FIG. 3 is a flowchart illustrating loudness matching according to the invention.

FIG. 3 shows an flowchart that shows an exemplary implementation of the loudness matching techniques discussed above. Firstly, the audio track is received or obtained 30 from any convenient source. Then, any desired pre-processing is performed 32, such as the pre-emphasis using an equal loudness contour discussed above. Then, the loudness values are obtained 34 for a number of frames. This can be done as discussed above by processing the audio track itself, or by reading loudness values or a histogram provided along with the audio track. In the case where preprocessing is performed, it may be desirable not to rely upon values provided with the audio track, but to either extract the values directly from the preprocessed track, or to provide some type of adjustment to any loudness values provided with the audio track.

At this stage, the weighting factors are applied 36 to the loudness values, and the loudness values are aggregated 38 to obtain the overall loudness value (the LLML). The loudness value is compared 40 with a desired loudness value, and an appropriate gain is applied 42 to the audio track based on the comparison. The audio track can then be played back, broadcast, streamed, etc. or stored for later use.

Turning now to compression, compressors are popularly said to reduce the dynamic range of an audio signal, though the term "dynamic range" is often used to refer to the difference between the peak signal level and the minimum signal level or noise floor. Even if the dynamic range is calculated based on the per-frame $V_{dB}$ evaluation discussed above, (for example, the difference between the $V_{dB}$ values of the loudest and softest frames) instead of per-sample, the result still reveals little about the distribution of dynamics. Range is one measure of the spread of a data set and is defined by the distance between the largest and smallest measurements. Because it is based on only two measurements, range is not always the most useful or robust measure of spread.

A better parameter for describing what compressors are intended to reduce is the "dynamic spread," which is a measure of the average absolute deviation from an average or median loudness level for the audio track. In one embodiment, the dynamic spread is defined as:

$$d = \frac{1}{M} \sum_{i=0}^{M-1} |V_{dB}(i) - \overline{V}|,$$

where d is the dynamic spread and $\overline{V}$ is either the mean or the median of $V_{dB}$. The dynamic spread is thus an "average" distance from the central or "average" per-frame level, and represents how "squashed" the audio is, either naturally (as in the case of the solo bassoon, with a dynamic range of perhaps 10 dB), or as a result of earlier compression.

Figure 4:
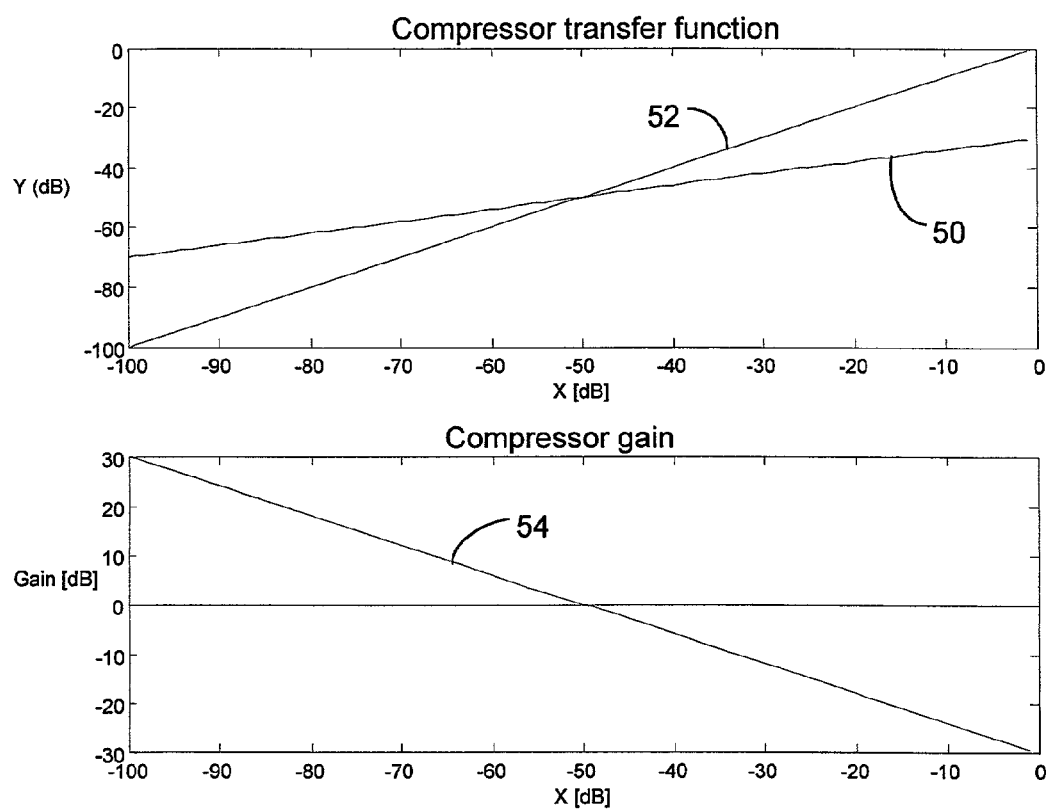
FIG. 4 shows two graphs illustrating the relationship between a straight line compressor function and the associated compressor gain.

The simplest way of reducing the dynamic spread of an audio track is to use a single line segment as the compressor's transfer function, as shown in FIG. 4, with a slope determined by $$S = \frac{d_d}{d_a},$$

where S is the slope, $d_a$ is the analyzed dynamic spread of the audio track and $d_d$ is the desired dynamic spread. Note that occasionally, the term "slope" is used to refer to the negative slope of the gain curve, or 1−1/R, where R is the compression ratio. However, as used here, "slope" simply means the slope of the transfer function line segment; in other words, the inverse of the compression ratio.

Referring to FIG. 4, shown is an exemplary single line segment transfer function 50 in the upper graph. As can be seen, input levels, shown on the X-axis, are transformed to output levels, shown on the Y-axis. So, for example a signal at −80 dB will be amplified to approximately −60 dB, while a signal at −20 dB will be attenuated to approximately −40 dB. Values at a neutral or central point, (−50 dB in the illustrated embodiment) will pass through the compressor unaltered. The neutral or central point may be selected to be near $\overline{v}$ for a particular audio track, so that the compression takes place around a central loudness value. The end result of the transfer function 52 is that the dynamic spread of the audio track is reduced. Note that the transfer function will apply a different gain to different frames, depending on the level of the frame. Throughout the audio track, the gain applied to the track will thus vary as the audio track progresses. Accordingly, it can be said that a compressor applies a time-varying gain to an audio track.

Slopes in the range $0 \leq S < 1$ produce compression. If the desired dynamic spread is wider than that of the original audio track, it may be preferable to leave the original as it is, rather than to apply expansion. If so, S can be limited to a maximum value of 1. A neutral transfer function 52, which will neither compress nor expand an audio track is also shown in FIG. 4.

While the use of a single line segment will yield the desired dynamic spread, it has an unfortunate effect on the signal-to-noise ratio. As can be seen from the compressor gain curve 54 that results from the exemplary transfer function 52, as the input signal level decreases, the compressor gain keeps increasing. The result is a very noisy compressor, because a large amount of gain is applied to those frames that already have the worst signal-to-noise ratio.

Figure 5:
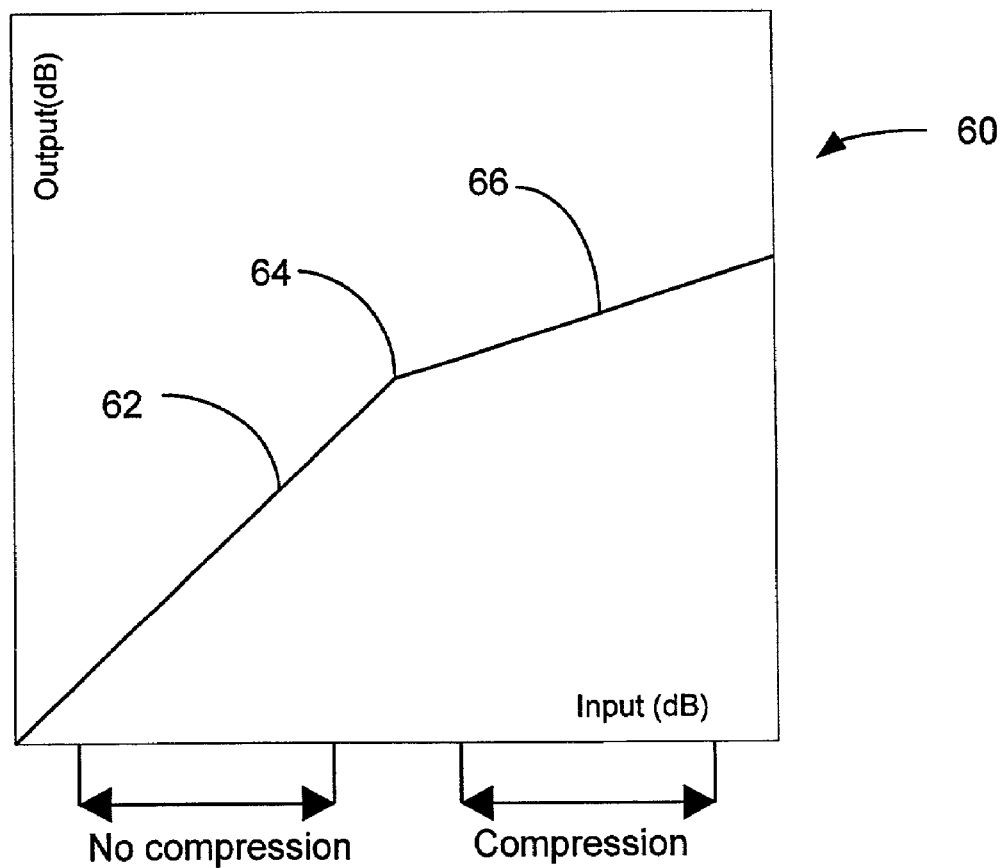
FIG. 5 is a graph showing a two-line compressor function with an intermediate breakpoint.

One way of ensuring that lower level frames do not receive large unwanted gains is to use a multi-line compressor transfer function, one example of which is shown in FIG. 5. The transfer function 60 shown in FIG. 5 is comprised of two straight line segments, although it will be appreciated that more than two segments, as well as curved line segments, could also be used. The transfer function 60 has a straight line segment 62 that has a slope of 1, so that no compression will be applied at lower decibel levels. Above a threshold point 64, the transfer function has a straight line segment 66 slope between 0 and 1, so that compression will be applied to the higher decibel levels. The transfer function 60 prevents any gain from being applied to the low-level frames, thus avoiding excessive noise amplification.

In certain circumstances, it may be appropriate to choose a fixed threshold point 64 independent of the audio track, but this may be problematic. For example, if an audio track has been normalized (i.e. a uniform gain applied to the audio track), it may fall substantially completely into the upper portion of the transfer function 60, and the normalized audio track may receive a large amount of compression, regardless of whether or not the audio track has a very narrow dynamic spread. Similarly, if an audio track has been attenuated it may fall substantially completely into the lower portion of the transfer function 60, and the attenuated audio track may receive no compression, regardless of whether or not the audio track has a very large dynamic spread.

Figure 6:
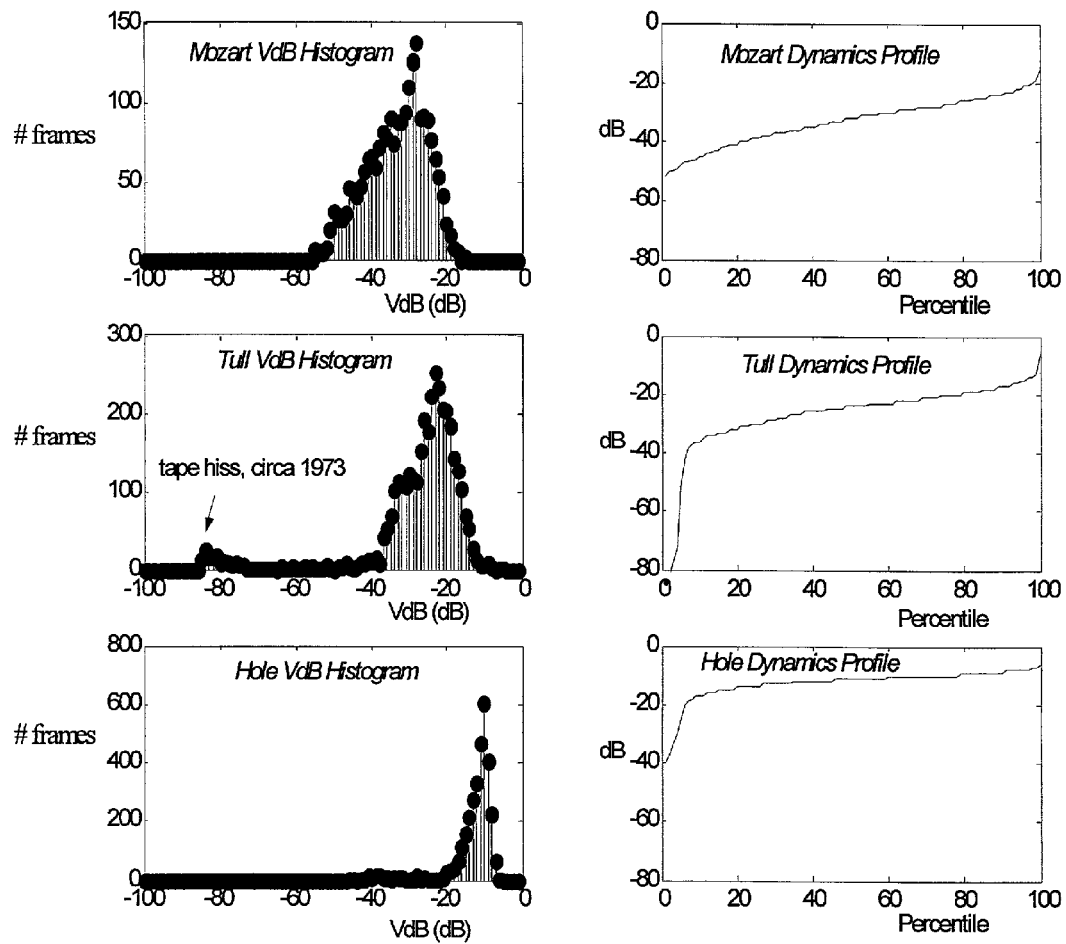
FIG. 6 shows the histograms and associated dynamics profiles for three different audio tracks.

Some of the challenges facing compressors can be illustrated using the $V_{dB}$ histograms (statistical frequency functions) shown on the left hand side of FIG. 6. The histograms provide a representation of the frequency distribution of three exemplary audio tracks, with the decibel level on the x-axis and the number of frames having that decibel level on the y-axis. In the illustrated histograms, the decibel level values are quantized to 1 decibel increments, representing a convenient one percent of the 100 dB full scale. Of course, other values could be used.

Using a fixed compressor threshold can be problematic. For example, the Mozart audio track represented by the upper histogram in FIG. 6 has a fairly wide dynamic spread, while the Hole audio track represented by the lower histogram has a fairly narrow dynamic spread. Using a two segment transfer function 60 with a fixed threshold 64 at −20 dB will result in a large amount of compression being applied to the Hole audio track, while applying almost no compression to the Mozart audio track. That is, by using a fixed threshold, an audio track that is in need of compression may receive no compression, while a highly compressed audio track may receive further compression.

To address this issue, it is desirable to provide specific compression to each audio track automatically. The selection of compression thresholds in this manner can be illustrated by the use of dynamics profiles, shown on the right hand side of FIG. 5. A dynamics profile provides an overview of the statistical (but not temporal) distribution of dynamics within an audio track. For a given percentile value P on the x-axis, the dynamics profile has a corresponding dB value V on the y-axis, such that P % of the frames in the audio track are softer or equal in loudness to V.

By choosing the compressor thresholds based on a statistical analysis of the audio track, the compressor function can be automatically customized for each audio track. For example, the compressor threshold 64 may be placed at the $60^{th}$ percentile, corresponding to approximately −30 dB for the Mozart audio track, and corresponding to approximately −10 dB for the Hole audio track. This method automatically adapts the breakpoint locations to the dynamics of the audio data, regardless of how the audio may have been scaled or compressed.

Figure 7:
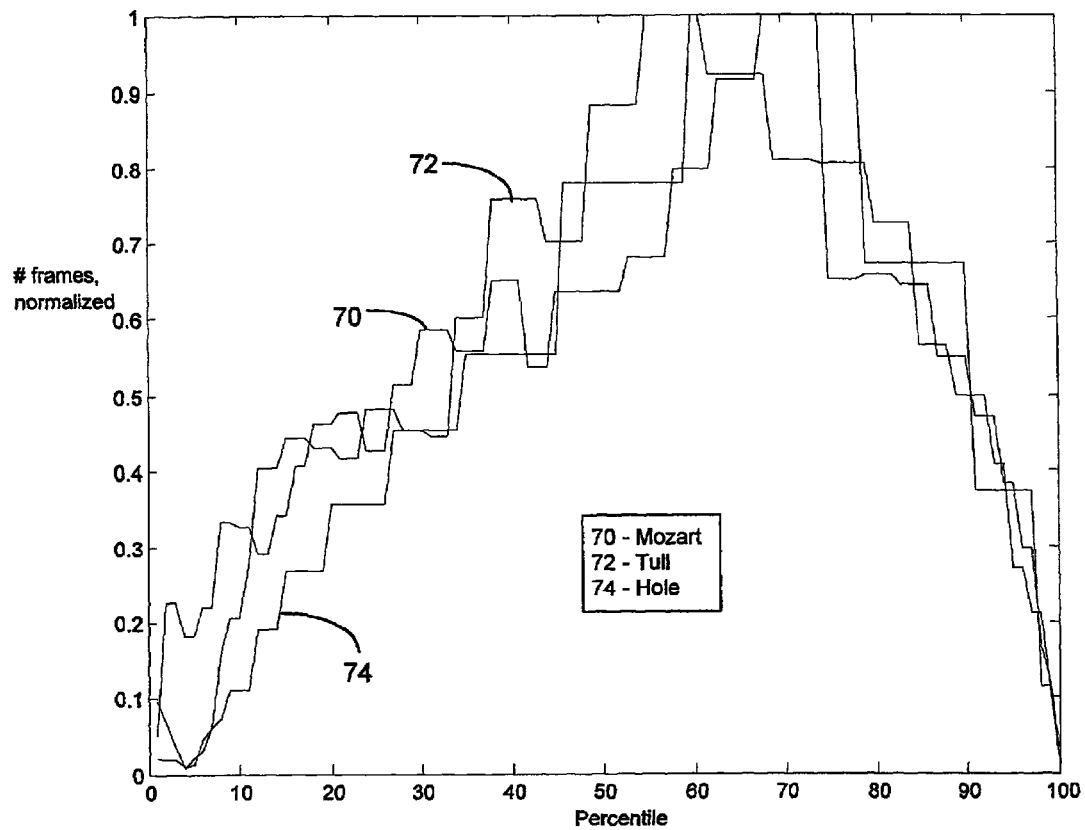
FIG. 7 shows the histograms of FIG. 6 normalized by number of frames and percentile.

In FIG. 7, it can be seen how the use of the percentile domain helps to normalize differences in loudness and dynamic spread between audio tracks. The $V_{dB}$ histograms (frames vs. dB) and dynamics profiles (dB vs. percentile) from FIG. 6 have been combined into a single plot of frames vs. percentile, with all three data sets superimposed. Note the greatly improved similarity between the histograms in FIG. 7 compared to their counterparts in FIG. 6. By specifying the compressor thresholds as a percentile (or other fractional measure), substantial independence from track-to-track variations in scaling and dynamics is achieved.

Once the x-axis breakpoint locations have been specified for the compressor transfer function, the next step is to determine the line segment slopes needed to yield the desired dynamic spread. A brute-force method would be simply to choose a slope, perform the actual compression on the entire audio track, measure the resulting dynamic spread and adjust the slope as needed, but this is processor intensive and thus, while acceptable, is not preferred.

Figure 8:
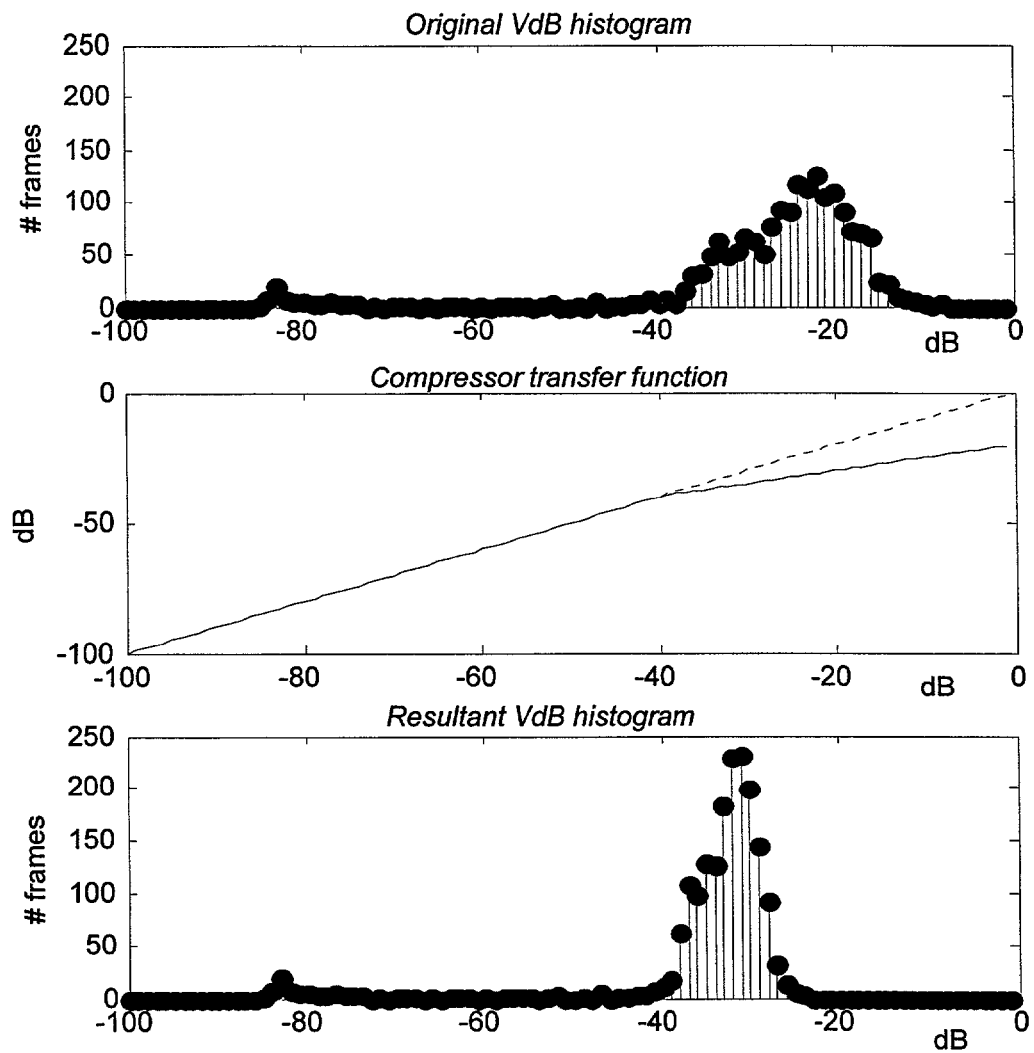
FIG. 8 illustrates the application of a transfer function to a histogram to estimate the effect of the transfer function on an audio track.

A much less processor intensive method is to predict the statistical results of the compression process. This can be done by applying a proposed transfer function directly to the audio file's $V_{dB}$ histogram data to create a new histogram. FIG. 8 illustrates how the effect of an arbitrary compressor function on the $V_{dB}$ histogram of an arbitrary audio track can be estimated, by applying the transfer function directly to the $V_{dB}$ histogram to create a new histogram.

Assume for the moment that the desired transfer function has two line segments: a stationary 45° segment (i.e. no compression or expansion) below the threshold and a compressor segment above the threshold whose slope is to be determined. If the slope of the compressor segment is initially set to 0° (horizontal) as a preliminary or test transfer function, this preliminary transfer function can be applied to the original $V_{dB}$ histogram to obtain an approximation of the $V_{dB}$ histogram that would result from this extreme, essentially limiting compression. By analyzing the resulting histogram data, an estimate can be obtained of the dynamic spread that would be obtained if the actual compression were to be performed.

Then, interpolation can be performed between this estimated dynamic spread and the dynamic spread of the original signal (which can be viewed as being compressed with unity slope; i.e., unchanged), to estimate the slope that will yield the desired dynamic spread. Assuming an approximately linear relationship between changes in slope and changes in dynamics spread, the slope for obtaining the desired dynamic spread can be determined from:

$$\frac{S_d - S_{min}}{S_{max} - S_{min}} = \frac{d_d - d_{min}}{d_{max} - d_{min}}$$

where $S_d$ is the desired slope, $S_{min}$ is the minimum slope (here, 0), $S_{max}$ is the maximum slope (or 1), $d_d$ is the desired dynamic spread, $d_{max}$ is the original dynamic spread (at unity slope), and $d_{min}$ is the dynamic spread obtained from applying compression with the compressor segment at minimum slope. While the example above uses a minimum slope of zero value, other values may be used for the test transfer function. For example, a minimum slope greater than zero might be desired in order to minimize detrimental sonic effects from extreme compression ratios.

Solving for $S_d$:

$$S_d = S_{min} + (1 - S_{min})\left(\frac{d_d - d_{min}}{d_{max} - d_{min}}\right).$$

If, after applying the new compressor curve to the original $V_{dB}$ histogram, the dynamic spread of the resulting histogram is not sufficiently close to the desired value, the interpolation process can be iterated until the desired precision is reached. Similar processes can be devised if the transfer function comprises additional line segments.

The process of applying a proposed compressor curve directly to the $V_{dB}$ histogram does not take into account the compressor's temporal attack and release characteristics. Note that if the compressor were to use instantaneous attack and release times, relying solely upon the level detector for its smoothing, the estimated histogram should match the actual result of the compression. Given sufficiently fast attack and release times (several hundred ms or less), the use of the proposed compressor curve in obtaining the $V_{dB}$ histogram estimate does not appear to cause significant skewing of the estimate over the course of an entire audio track. This might pose a larger problem for automatic gain controls, due to their slower time constants.

At this stage, the audio track has been compressed to the desired dynamic spread, but the compression may have affected the loudness of the audio track. Dynamic compression changes the overall loudness of an audio track in a signal-dependent way. Compressors typically apply a fixed or user-controlled post-compressor gain, but the fixed gain is often too much or too little, depending on the particular audio track.

Without performing some sort of statistical analysis, it is difficult to predict how an arbitrary compression curve will affect the overall loudness of an arbitrary audio track, even if its original loudness is known, because the result depends on the distribution of the audio track's energy and how that aligns with the compression curve. In order to apply loudness matching at the output of the compressor in real-time, it is preferable to estimate the compressor's effect on a particular audio track.

This is done using the technique illustrated in FIG. 8, in which the compressor's transfer function is applied to the audio track's original (uncompressed) $V_{dB}$ histogram. By applying the compressor's static transfer function directly to the original $V_{dB}$ histogram, an estimate of the histogram of the compressed audio track can be obtained. The LLML analysis process is then applied to the new histogram to estimate the LLML of the audio track after it is compressed. The estimated LLML value can in turn be used to determine the amount of post-gain needed for loudness matching as discussed above. The post-gain can be considered to be a correction factor that is applied with the compressor transfer function to obtain a desired LLML value after compression.

Figure 2:
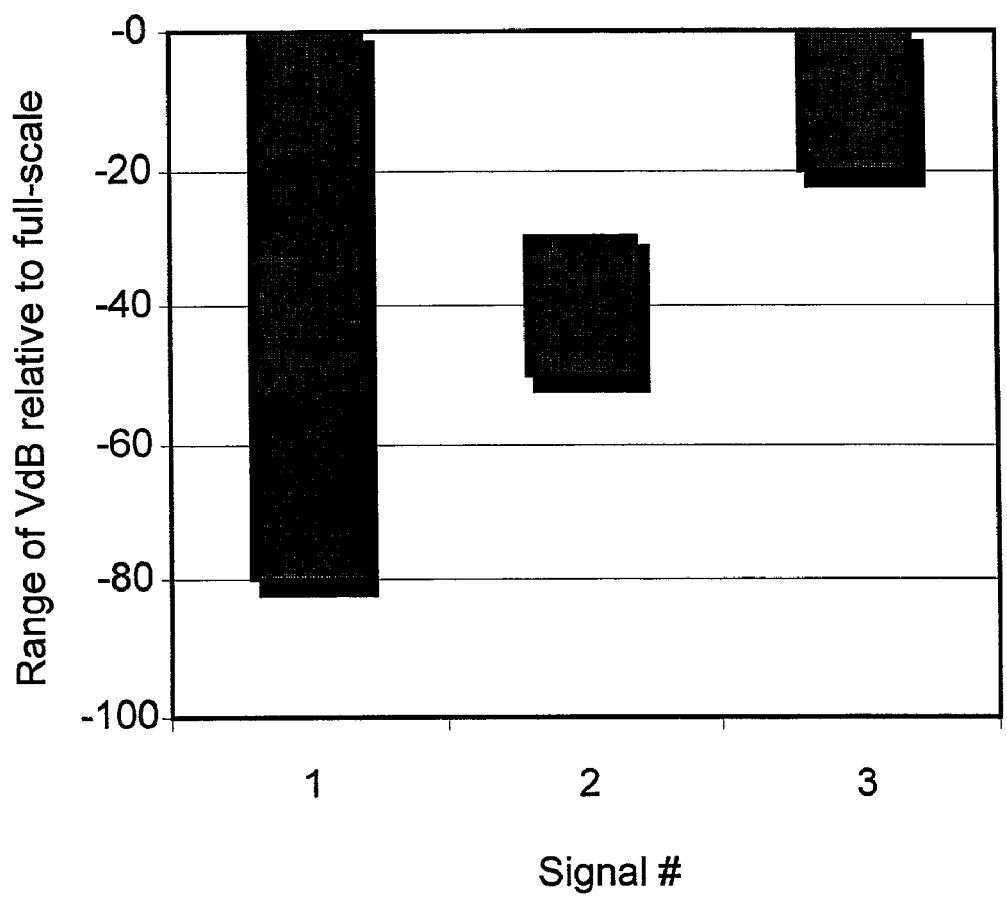
FIG. 2 is a graph illustrating the dynamic ranges of three different audio tracks.

The loudness normalization is calculated immediately before playback and then applied in the post-compression gain block shown in FIG. 2. The equal-loudness filter used in the compressor should substantially match the one used to generate the $V_{dB}$ data during the audio track analysis phase.

Figure 9:
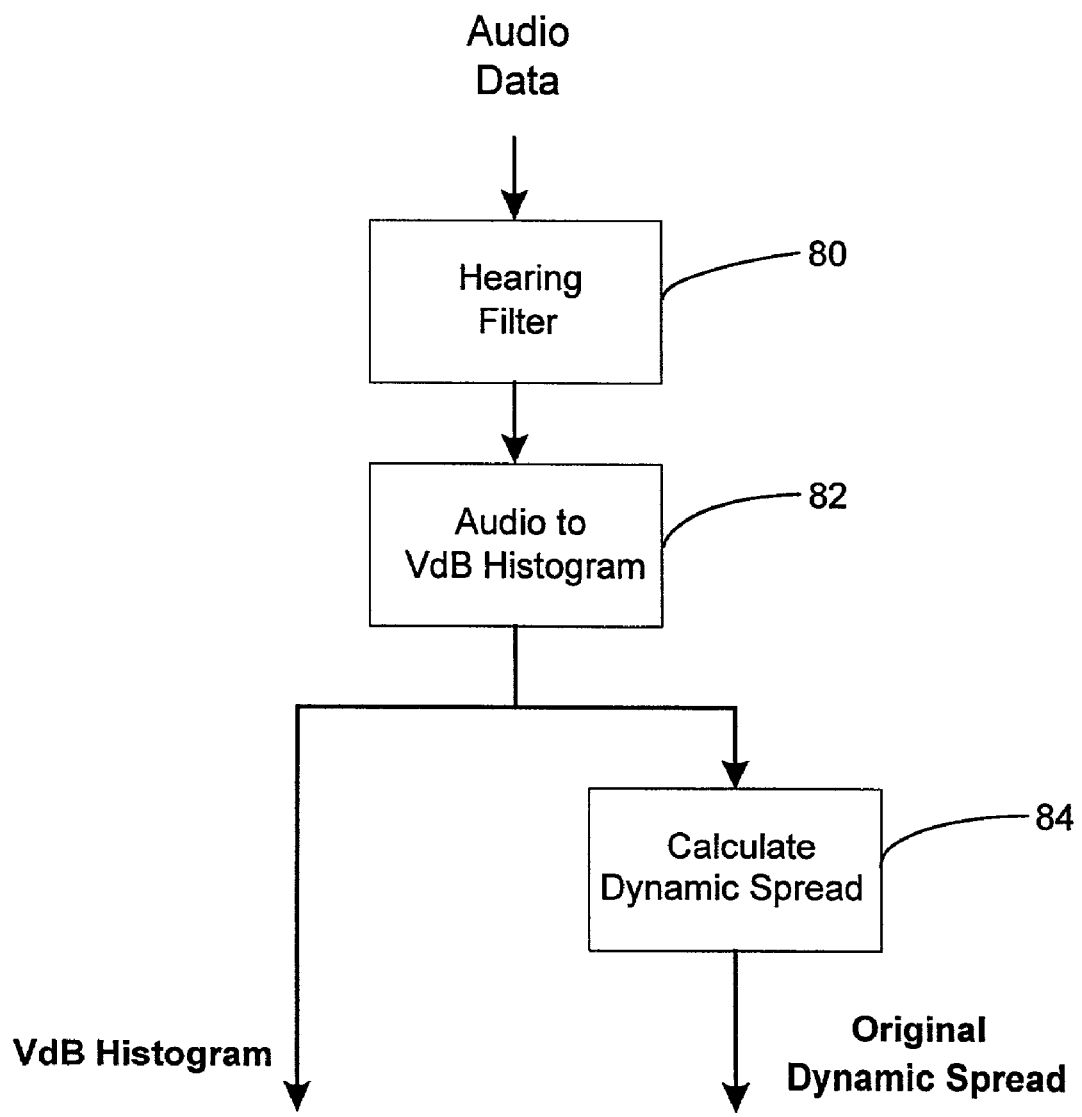
FIGS. 9 and 10 are two flowcharts that together illustrate the determination of compressor parameters and post compressor gain to achieve a desired loudness level and dynamic spread.

An integrated method of determining the compressor transfer function and desired post compressor gain will now be discussed with reference to FIGS. 9 and 10. Any desired preprocessing (for example the application of an equal-loudness filter) is conducted 80. The $V_{dB}$ histogram for the preprocessed audio track is then determined 82. From the $V_{dB}$ histogram, the dynamic spread can be calculated 84.

Figure 10:
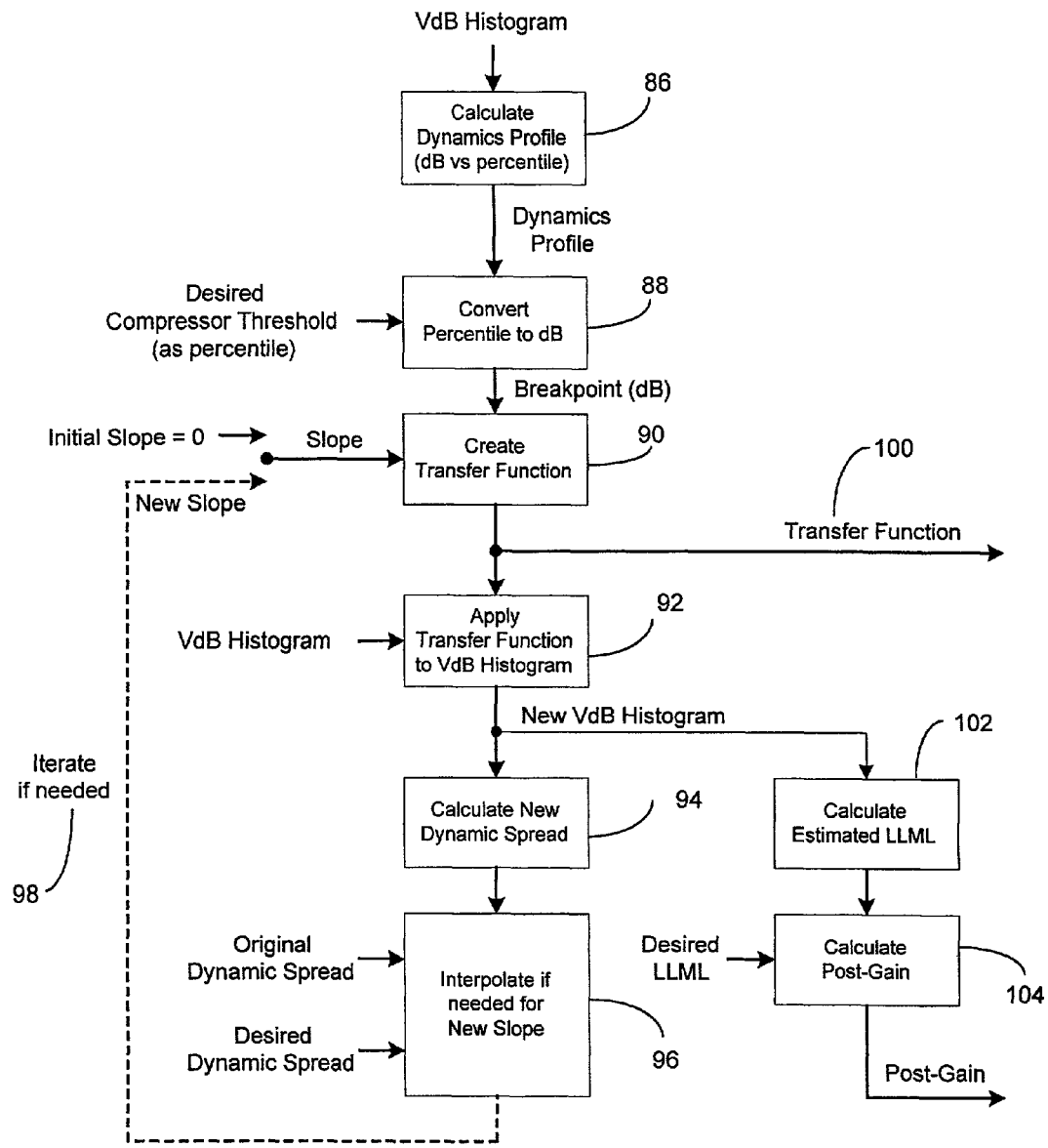

Referring now to FIG. 10, the dynamics profile of the audio track is calculated 86 from the original $V_{dB}$ histogram. Using the desired compressor threshold (expressed as a percentile) as an input, the transfer function breakpoint is determined from the calculated dynamics profile 88. An initial transfer function is then generated 90 using the calculated breakpoint and an initial slope of zero for the upper portion of the transfer function. The initial transfer function is then applied 92 to the original $V_{dB}$ histogram to generate a new $V_{dB}$ histogram, which is an estimate of the effect of the initial transfer function on the audio track.

Using the new $V_{dB}$ histogram, a new dynamic spread is calculated 94. Using the original dynamic spread, the desired dynamic spread, and the calculated dynamic spread, an interpolation is performed to generate an estimate of the slope required to obtain the desired dynamic spread. Using the interpolated slope, a new transfer function is created 90. The new transfer function is then applied to the original $V_{dB}$ histogram 92 to obtain a further new $V_{dB}$ histogram. From the new $V_{dB}$ histogram, a new dynamic spread may be calculated 94.

If the new dynamic spread is not sufficiently close to the desired dynamic spread, iterations 98 can be performed as desired until the calculated dynamic spread is sufficiently close to the desired dynamic spread. When the calculated dynamic spread is sufficiently close to the desired dynamic spread, the determination of the transfer function is now complete. The transfer function in this example is defined by the initial breakpoint and the interpolated and/or iterated slope 100.

From the estimated $V_{dB}$ histogram for the compressed audio track (determined by applying the finalized transfer function to the original $V_{dB}$ histogram), the estimated long term loudness matching level can be determined 102. Using the calculated long term loudness matching level and the desired long term loudness matching level, a post compressor gain may be calculated 104.

Figure 11:
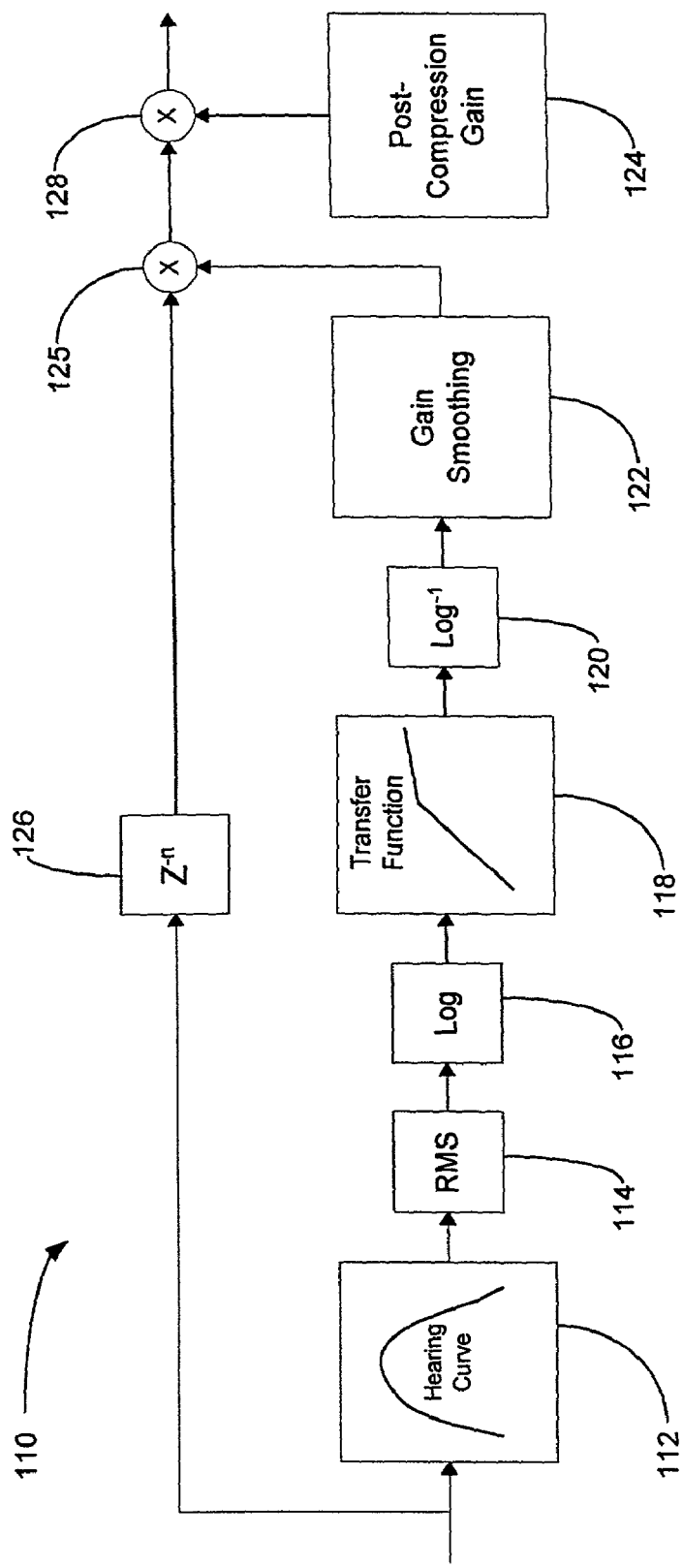
FIG. 11 is a block diagram of a compressor in which an audio track is processed.

A compressor 110 suitable for use in the invention is shown in FIG. 11. The compressor 110 is normally provided as a module of the audio subsystem 22 of the system 10 shown in FIG. 1. A frame 126 to be processed by the compressor 110 first has an equal loudness hearing curve 112 (or other optional preprocessing function) applied to it. The root mean square 114 of the preprocessed signal within the frame is then determined. As the transfer function operates in the logarithm domain, the logarithm value 116 of the frame RMS value is then determined. The transfer function 118 is then applied to the logarithmic value. The antilog 120 of the value passed from the transfer function 118 is then obtained. Gain smoothing 122 is then applied to the antilogarithm value to ensure that there are no large discontinuities between adjacent frames. The resultant gain value is then applied 125 to the frame 126 under consideration. The post compression gain 124 is then applied 128 to the post compressor frame. Of course, the parameters for the transfer function and for the post compression gain will have been determined as described about with reference to FIGS. 1-10.

Figure 12:
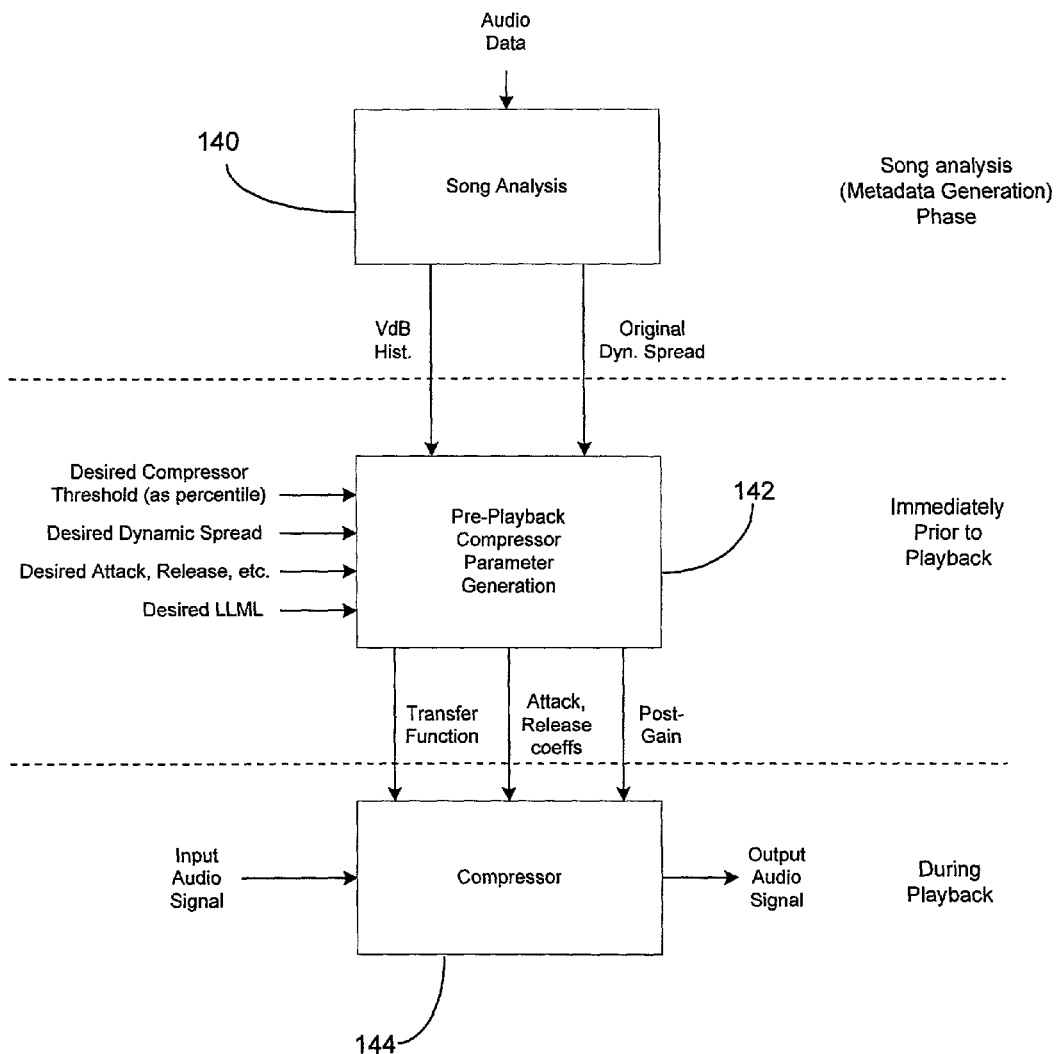
FIG. 12 is a schematic diagram illustrating the general sequence and components of audio track analysis, compressor parameter generation and audio playback.
Figure 3:
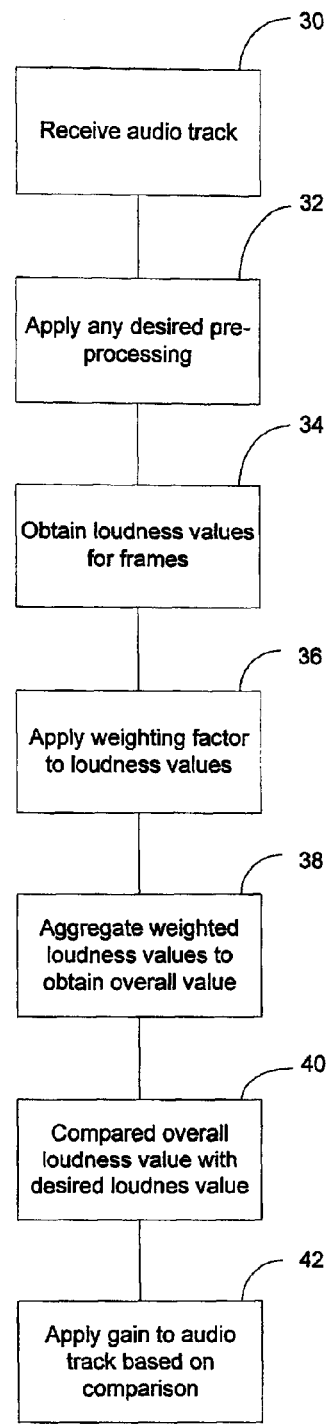

The typical (although not required) phases of the invention are illustrated in FIG. 12. For a particular audio track, an analysis phase 140 is conducted first. The analysis phase generates the metadata comprising the $V_{dB}$ histogram and the original dynamic spread. As discussed previously, the $V_{dB}$ histogram and the original dynamic spread may be determined by the provider of the audio track, and embodied on or in the media on which the audio track is provided. For example, the $V_{dB}$ histogram and the original dynamic spread may be embodied on a machine readable medium such as a compact disk or other data storage medium together with the audio track. Alternatively, it may be determined at some other stage prior to playback. Additionally, the original dynamic spread may be calculated from the $V_{dB}$ histogram.

Prior to playback, the compressor parameter generation is performed 142. Note however that this parameter generation can be performed at any time prior to playback upon the availability of the required parameters. The desired compressor threshold, the desired dynamic spread, and the desired long term loudness matching level are used to determine the compressor transfer function and the required post-compressor gain as described above with reference to FIGS. 1-10. The attack and release coefficients are provided in a conventional manner.

During playback, the determined transfer function, attack and release coefficients, and post gain are provided as parameters to the compressor. Using the determined parameters, the compressor processes 144 the audio track to provide the compressed and loudness matched audio track.

Finally, the methods disclosed herein may be embodied as machine readable instructions, or as an article of manufacture embodying machine readable instructions. For example, using Matlab™ by The Mathworks, Inc., the instructions for obtaining the $V_{dB}$ histogram would be as shown in Listing 1 (using positive array indices to represent negative dB histogram bins).

```
Hist=zeros(100,1);           % Allocate array
for i=1:100                  % for each frame
    Bin = -round(VdB(i));
    if Bin < 1, Bin = 1; end;
    if Bin > 100, Bin = 100; end;
    Hist[Bin] = Hist[Bin] +1;
End
```

Listing 1. Creating a $V_{dB}$ histogram.

Similarly, the Matlab™ instructions for deriving the dynamics profile from the $V_{dB}$ histogram is shown in Listing 2:

```
% Allocate arrays
dBVsPercent = zeros(100, 1);
relFreqVsPercent = zeros(100, 1);
indx = 101;                  % Start at –100 dB
sum = 0;
for i=1:100                  % for each percentile
    % Find the lowest dB level whose relative frequency exceeds
    this percentile.
    while sum < 0.01*i
        indx = indx – 1;
        if indx < 1
            indx = 1;
            break;
        end;
        sum = sum + relFreqVsdB(indx);
    end
    dBVsPercent(i) = -indx;
end
```

Listing 2. Deriving dynamics profile from the $V_{dB}$ histogram.

Still further, the $V_{dB}$ histogram of the compressed audio track can be estimated by applying the transfer function to the original $V_{dB}$ histogram as shown in Listing 3:

% Allocate array
newRelFreqVsdB=zeros(100, 1);
% The indices of xferFcn represent input levels in negative dB;
% the array contents represent the corresponding output levels.
    for i=1:100% for each orig. –dB
    newDBLevel=round(xferFcn(i));
    newRelFreqVsdB(–newDBLevel)= . . . newRelFreqVsdB(–newDBLevel)+relativeFreqVsdB(i); end Listing 3. Applying the transfer function to the $V_{dB}$ histogram.

Having thus described exemplary embodiments of the present invention, it is noted that the disclosures herein are exemplary only and that various other alterations, adaptations and modifications may be made within the spirit and scope of the present invention. Accordingly, the present invention is not limited to the specific embodiments as illustrated herein.

What is claimed is:

1. A method of adjusting the dynamics of a digital audio track, the method implemented on a computerized system, comprising:
   evaluating an audio track to determine the loudness levels of a plurality of frames in the audio track such that the loudness levels of the plurality of frames are representative of the loudness distribution of frames across the entire audio track;
   determining an apparent loudness weighting for the plurality of frames of the audio track such that the weighting emphasizes the relatively greater effect that louder frames have on loudness perception, while including the contribution to overall loudness made by less loud frame; and
   adjusting the loudness of the track based on the determined loudness levels and apparent loudness weighting of the plurality of frames so that the apparent loudness of the track matches a desired apparent loudness, the adjusting performed via a nonlinear compressor transfer function determined by estimating dynamic spread on the audio track with a calculated non-linear compressor transfer function applied by applying the calculated non-linear compressor transfer function to at least one of histogram or sample frame data.

2. The method of adjusting the dynamics of a digital audio track of claim 1, wherein evaluating an audio track to determine the distribution of loudness levels present in the audio track comprises determining levels for all frames comprising the audio track.

3. The method of adjusting the dynamics of a digital audio track of claim 1, wherein evaluating an audio track to determine loudness levels for a plurality of frames in the audio track comprises determining levels for frames sampled from across all frames comprising the audio track.

4. The method of adjusting the dynamics of a digital audio track of claim 1, wherein evaluating an audio track to determine loudness levels for a plurality of frames in the audio track comprises determining levels for all frames in the audio track.

5. The method of adjusting the dynamics of a digital audio track of claim 1, further comprising using an emphasis parameter to derive the apparent loudness weight of an individual frame of the audio track such that the apparent loudness weight comprises the emphasis parameter raised to the negative power of a loudness value for the frame.

6. The method of adjusting the dynamics of an audio track of claim 1, wherein at least one of evaluating an audio track to determine the loudness levels of a plurality of frames and determining an apparent loudness weighting for the plurality of frames comprises performing such calculations based on loudness value distribution information for the audio track represented in a histogram.

7. The method of adjusting the dynamics of a digital audio track of claim 1, wherein the apparent loudness weight is frequency-weighted to compensate for perceived loudness differences at different frequencies.

8. The method of adjusting the dynamics of a digital audio track of claim 1, wherein adjusting the loudness of the track comprises combining aggregated weighted loudness values to determine apparent loudness for the track.

9. A method of adjusting the dynamics of a digital audio track, the method implemented on a computerized system, comprising:
   evaluating an audio track to determine the loudness levels of a plurality of frames in the audio track such that the loudness levels of the plurality of frames are representative of the loudness distribution of frames across the entire audio track;
   using the loudness levels of a plurality of frames in the audio track to calculate a dynamic spread of the audio track;
   determining a non-linear compressor transfer function configured to produce a desired dynamic spread by estimating dynamic spread on the audio track with a calculated non-linear compressor transfer function applied by applying the calculated non-linear compressor transfer function to at least one of histogram or sample frame data, the non-linear compressor transfer function comprising greater dynamic range compression at high loudness levels than at low loudness levels; and applying the determined non-linear compressor transfer function to the audio track to produce an audio track with the desired dynamic spread.

10. The method of adjusting the dynamics of a digital audio track of claim 9, further comprising adjusting the loudness of the track based on the determined loudness levels so that the apparent loudness of the track matches a desired apparent loudness.

11. The method of adjusting the dynamics of a digital audio track of claim 9, wherein a threshold between linear segments of the non-linear compressor transfer function is based on statistical analysis of audio track.

12. The method of adjusting the dynamics of a digital audio track of claim 11, wherein the threshold is at specified percentile domain of loudness levels in the audio track.

13. The method of adjusting the dynamics of a digital audio track of claim 11, further comprising normalizing the loudness of the specified percentile domain of loudness levels in audio track to a desired loudness level.

14. The method of adjusting the dynamics of a digital audio track of claim 9, wherein the non-linear compressor transfer function is iteratively calculated to achieve a desired dynamic spread.

* * * * *

UNITED STATES PATENT AND TRADEMARK OFFICE
CERTIFICATE OF CORRECTION

PATENT NO. : 7,848,531 B1
APPLICATION NO. : 10/043591
DATED : December 7, 2010
INVENTOR(S) : Earl Vickers et al.

It is certified that error appears in the above-identified patent and that said Letters Patent is hereby corrected as shown below:

On Sheet 3 of 12, Reference Numeral 40, Figure 3, line 3, delete "loudnes" and insert -- loudness --, therefor. (see attached)

In column 2, lines 9-11, delete "dynamics distribution encountered in the resulting audio track is substantially similar to the desired statistical dynamics distribution." and insert the same on Col. 2 Line 8, after "statistical", as a continuation of the paragraph.

In column 7, line 52, delete " $\overline{\overline{V}}$ " and insert -- $\overline{V}$ --, therefor.

In column 8, line 16, delete " $\overline{\overline{V}}$ " and insert -- $\overline{V}$ --, therefor.

In column 10, line 26, after " $\dfrac{S_d - S_{min}}{S_{max} - S_{min}} = \dfrac{d_d - d_{min}}{d_{max} - d_{min}}$ " insert -- , --.

Signed and Sealed this
First Day of March, 2011

David J. Kappos
*Director of the United States Patent and Trademark Office*